United States Patent
Kitazawa

(10) Patent No.: US 12,263,673 B2
(45) Date of Patent: Apr. 1, 2025

(54) PROCESSING APPARATUS

(71) Applicant: CANON KABUSHIKI KAISHA, Tokyo (JP)

(72) Inventor: Toshiyuki Kitazawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 172 days.

(21) Appl. No.: 17/746,185

(22) Filed: May 17, 2022

(65) Prior Publication Data

US 2022/0371342 A1  Nov. 24, 2022

(30) Foreign Application Priority Data

May 18, 2021  (JP) ................................. 2021-084085

(51) Int. Cl.
*B41J 11/42*  (2006.01)
*H03K 3/35*  (2006.01)

(52) U.S. Cl.
CPC ................ *B41J 11/42* (2013.01); *H03K 3/35* (2013.01)

(58) Field of Classification Search
None
See application file for complete search history.

(56) References Cited

U.S. PATENT DOCUMENTS

| | | |
|---|---|---|
| 7,536,568 B2 | 5/2009 | Price et al. |
| 8,041,964 B2 | 10/2011 | Price et al. |
| 2007/0130479 A1 | 6/2007 | Price et al. |
| 2008/0037296 A1* | 2/2008 | Hsu ........................ H02M 1/08 363/41 |
| 2009/0289698 A1 | 11/2009 | Price et al. |
| 2012/0191999 A1* | 7/2012 | Takatani ............ H04N 1/00896 713/323 |
| 2021/0063923 A1* | 3/2021 | Odate ................ G03G 15/5004 |

FOREIGN PATENT DOCUMENTS

JP  2007-189891 A  7/2007

\* cited by examiner

*Primary Examiner* — Alejandro Valencia
(74) *Attorney, Agent, or Firm* — Venable LLP

(57) ABSTRACT

A processing apparatus comprises: an integrated circuit; a power supply unit connected to an external power supply and configured to perform power supply to the integrated circuit; and a power switch configured to switch a state of the processing apparatus based on power supplied from the power supply unit. The integrated circuit comprises a control unit configured to control a power state of the integrated circuit in a state in which power supply to the integrated circuit is being performed by the power supply unit.

5 Claims, 5 Drawing Sheets

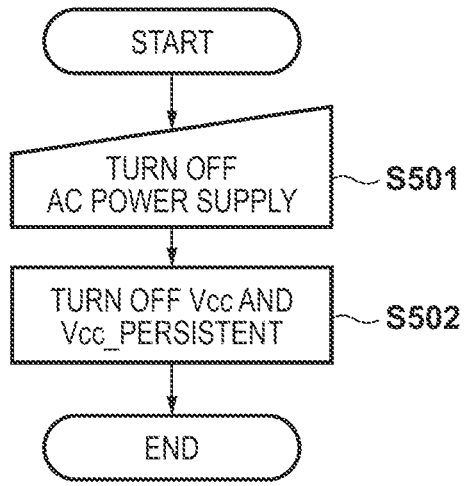
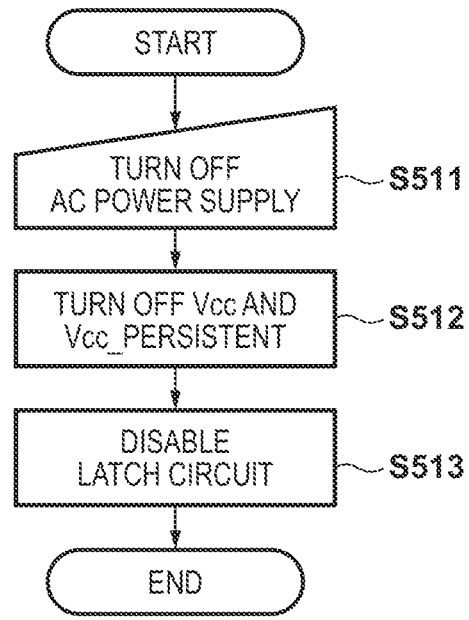
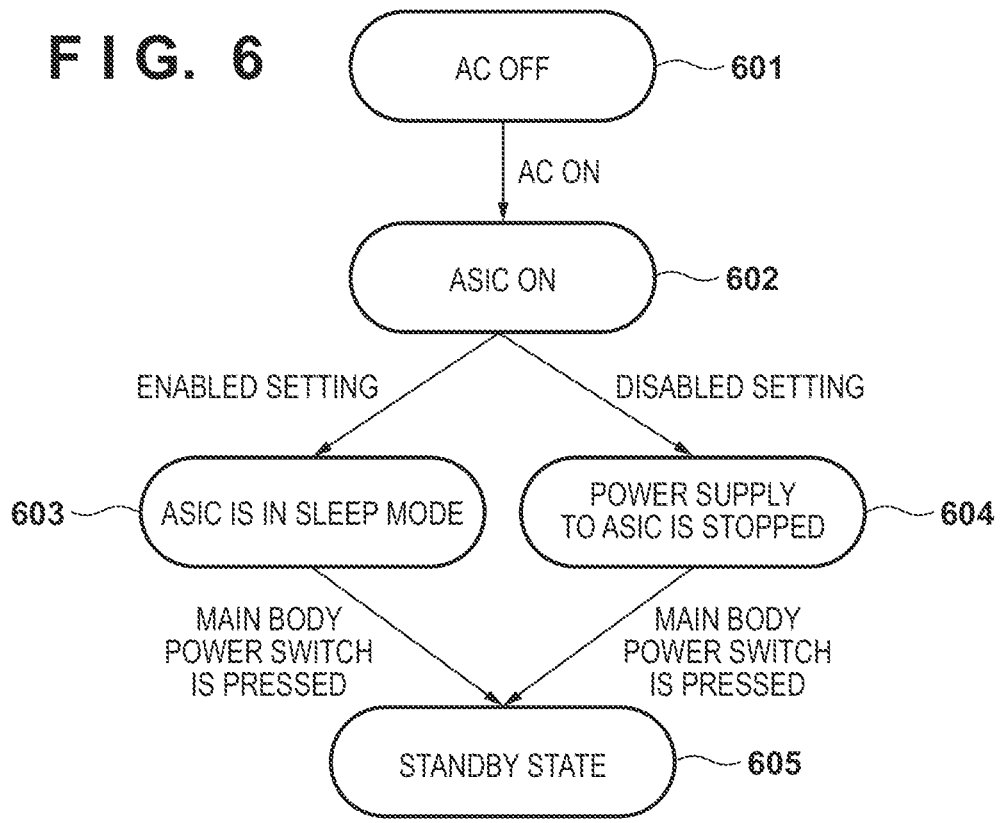

PROCESSING APPARATUS

BACKGROUND

Field

The present disclosure relates to a processing apparatus including an integrated circuit capable of processing a job.

Description of the Related Art

Generally, in a network device including a printing apparatus, an integrated circuit such as an ASIC often operates and continues some processes even in an energy saving mode. To further save power, most or all of the functions of the integrated circuit are limited in some cases. Patent literature 1 describes a configuration for reducing power consumption by stopping power supply to a controller in the energy saving mode of a device.

In Japanese Patent Laid-Open No. 2007-189891, in the energy saving mode of a device, power consumption is reduced by stopping power supply to a controller. In patent literature 1, if a detection circuit detects an operation of input by a user during the energy saving mode of the device, a power supply supplies power to the controller, and a latch circuit operates to continue the power supply. In addition, the controller disables the latch circuit in response to an operation of user input for shifting to the energy saving mode.

It is known that a printing apparatus has a function to shift to a state in which it can process a job request if the job request is received from the outside in a state in which an AC power supply is on, and a main body power switch is off.

SUMMARY

The present disclosure in one aspect provides a processing apparatus comprising: an integrated circuit; a power supply unit connected to an external power supply and configured to perform power supply to the integrated circuit; and a power switch configured to switch a state of the processing apparatus based on power supplied from the power supply unit, wherein the integrated circuit comprises a control unit configured to control a power state of the integrated circuit in a state in which power supply to the integrated circuit is being performed by the power supply unit.

Further features of the present disclosure will become apparent from the following description of exemplary embodiments (with reference to the attached drawings).

BRIEF DESCRIPTION OF THE DRAWINGS

FIGS. 5A and 5B are flowcharts showing processing in a case in which power supply to a power supply unit is stopped; and FIG. 6 is a view for explaining state transition of the printing apparatus.

DESCRIPTION OF THE EMBODIMENTS

Figure 1:
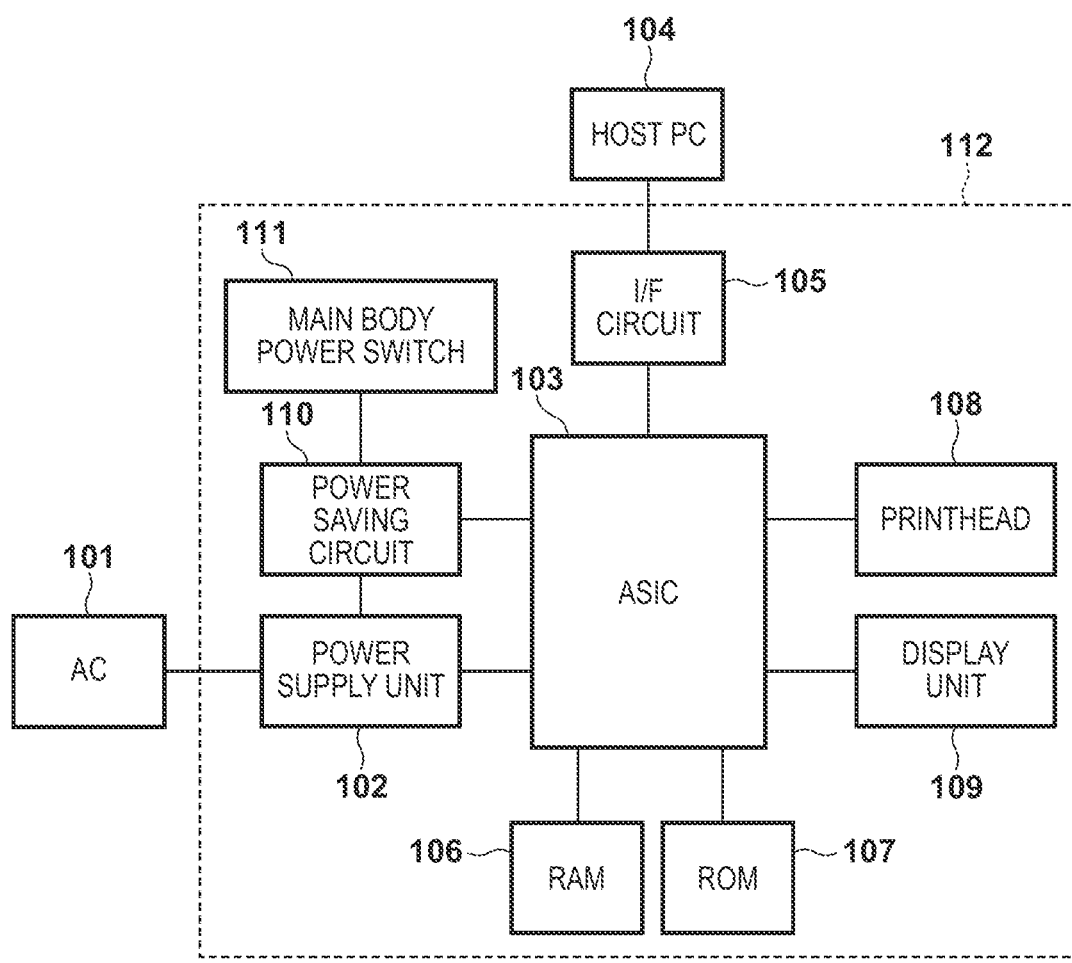
FIG. 1 is a block diagram showing the schematic configuration of a printing system.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Japanese Patent Laid-Open No. 2007-189891 describes that power supply to a controller is started in response to an operation of input by a user. In Japanese Patent Laid-Open No. 2007-189891, however, there is no mention about controlling power supply to an integrated circuit such as a controller in accordance with the setting of the above-described function of the printing apparatus if an AC power supply is turned on.

It is an object of the present disclosure to provide a processing apparatus that appropriately controls power supply to an integrated circuit.

FIG. 1 is a block diagram showing an example of the schematic configuration of a printing system including a printing apparatus 112 according to this embodiment and a host PC 104 that is an external device. FIG. 1 mainly shows a block configuration associated with an operation according to this embodiment. Power is supplied from an AC power supply 101 that is an external power supply to a power supply unit 102 of the printing apparatus 112 via an AC cable or the like, and the power supply unit 102 supplies the power to units including an integrated circuit 103. In this embodiment, the integrated circuit 103 is formed by, for example, an ASIC (Application Specific Integrated Circuit), incorporates peripheral functions such as a CPU, a memory, and a timer, and operates as a controller that generally controls the interior of the printing apparatus 112. Also, in this embodiment, the integrated circuit 103 will be described as an ASIC, but it may be an integrated circuit of another form such as an FPGA. In this embodiment, the printing apparatus 112 that prints on a print medium will be described as an example. However, the apparatus in which the integrated circuit 103 is mounted need not always be a printing apparatus if it can implement a control operation for the power state of the integrated circuit 103 according to this embodiment. For example, not a printing apparatus but an information processing apparatus having the configuration of a general-purpose PC may be used.

A control command or print data transmitted from the host PC 104 is received by an interface (I/F) circuit 105. Note that a wired communication network, a wireless communication network, or a network including both is formed between the printing apparatus 112 and the host PC 104. The host PC 104 may be a portable terminal such as a smartphone if it can transmit a job to the printing apparatus 112. The I/F circuit 105 has a configuration corresponding to the network medium to the host PC 104. The integrated circuit 103 executes, for example, image processing for print data received by the I/F circuit 105 and expands it on a RAM 106. A ROM 107 stores programs used by the integrated circuit 103 to operate and various kinds of tables necessary for control of a printhead 108. In addition, the ROM 107 operates as a storage unit that stores a user setting concerning a power state to which the printing apparatus 112 transitions when the AC power supply 101 is turned on, as will be described later.

The printhead 108 includes nozzles configured to discharge color ink droplets of, for example, cyan, magenta, yellow, and black to a print medium such as a sheet. The printhead 108 is, for example, a so-called serial-type printhead that discharges ink droplets while reciprocally scanning in a direction orthogonal to the conveyance direction of the print medium. The printhead 108 may be a so-called line-type printhead including a nozzle array formed over the widthwise region of the print medium. In a printing operation, the integrated circuit 103 controls the printhead 108 based on the tables and the like stored in the ROM 107, thereby performing printing on the print medium.

A display unit 109 is configured to include a panel and the like, and can display various kinds of user interface screens. Display of the display unit 109 is controlled by the integrated circuit 103. The display unit 109 may be configured to include hard keys, soft keys, and the like and accept a user operation. Although not illustrated in FIG. 1, an operation unit capable of accepting a user operation may be separately provided.

A main body power switch 111 is a power switch that the user can operate, and is configured to as, for example, a self-reset type switch that changes a contact only when pressed. In accordance with a user operation, the main body power switch 111 switches the printing apparatus 112 from a power off state to a standby state, or from a standby state and other operation states to a power off state. Here, the standby state is a state of the printing apparatus 112, in which power is supplied to the integrated circuit 103 and the display unit 109, and a user operation or a job can be processed. A power saving circuit 110 is connected to the power supply unit 102, the integrated circuit 103, and the main body power switch 111, and these components will be described later.

Figure 2:
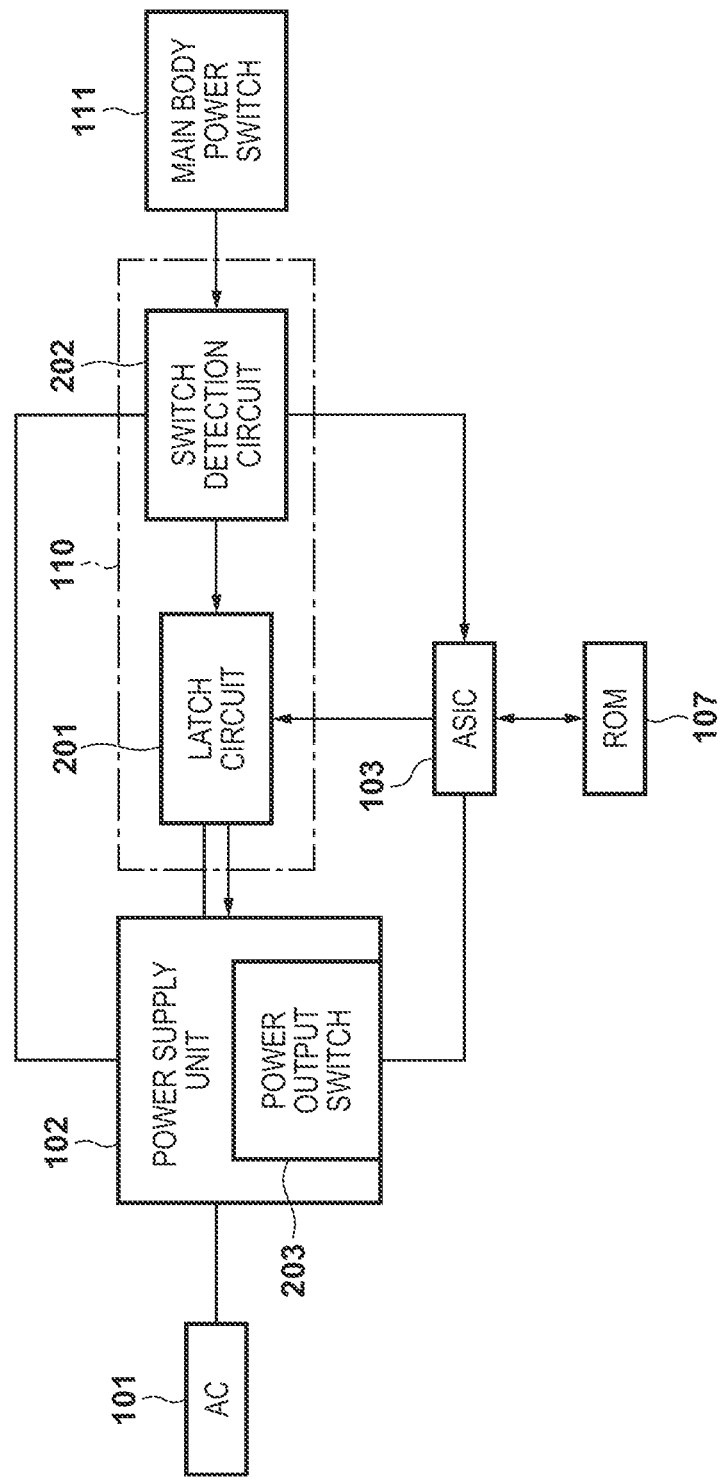
FIG. 2 is a block diagram showing a configuration concerning power supply control of a printing apparatus.

FIG. 2 is a block diagram showing an example of a configuration concerning power supply control of the printing apparatus 112. FIG. 2 shows the power saving circuit 110 and peripheral configurations thereof. The power saving circuit 110 includes a latch circuit 201 and a switch detection circuit 202. When power is supplied from the AC power supply 101 to the power supply unit 102, the power supply unit 102 can supply the power to the integrated circuit 103, the latch circuit 201, and the switch detection circuit 202. The latch circuit 201 is a circuit that includes an NPN transistor and a PNP transistor and performs an operation of maintaining an output to a certain input. The power supply unit 102 includes a power output switch 203, and can selectively switch ON/OFF of power output to the integrated circuit 103.

The printing apparatus 112 has, as a power supply control function, a function to shift to a state in which it can process a job request if the job request is received from the host PC 104 in a state (power off state) in which the AC power supply 101 is turned on, and the main body power switch 111 is not operated. The power supply control function will be referred to as an "automatic power-on function" hereinafter. Enable/disable of the "automatic power-on function" can be set by a user setting. In this embodiment, state transition performed when the AC power supply 101 is turned on changes between a case in which the "automatic power-on function" is enabled and a case in which the "automatic power-on function" is disabled.

State transition of the printing apparatus 112, which is performed when the AC power supply 101 is turned on, will be described here for each of the case in which the "automatic power-on function" is enabled and the case in which the "automatic power-on function" is disabled.

FIG. 6 is a view for explaining state transition of the printing apparatus 112. FIG. 6 shows state transition after the AC power supply 101 is turned on (AC ON) until the printing apparatus 112 shifts to the standby state. If the AC power supply 101 is turned on in a state 601 in which the AC power supply 101 is off, the printing apparatus 112 transitions to a state 602. In the state 602, power is supplied to the integrated circuit 103. Here, the integrated circuit 103 is temporarily set in a normal operation mode in accordance with supply of the power. The integrated circuit 103 refers to a user setting concerning the "automatic power-on function" stored in the ROM 107.

If the "automatic power-on function" is enabled as the user setting, the printing apparatus 112 transitions to a state 603. In the state 603, the integrated circuit 103 is in a sleep mode. The sleep mode is a state in which the integrated circuit 103 can process a job, but power consumption is suppressed by limiting some functions such as peripheral functions. If the main body power switch 111 is operated in the state 603, the integrated circuit 103 returns from the sleep mode to the normal operation mode, and the printing apparatus 112 transitions to a standby state 605.

On the other hand, if the "automatic power-on function" is disabled as the user setting, the printing apparatus 112 transitions to a state 604. In the state 604, power supply to the integrated circuit 103 is stopped. If the main body power switch 111 is operated in the state 604, the integrated circuit 103 is set in the normal operation mode in accordance with supply of the power and transitions to the standby state 605.

As described above, in this embodiment, when the AC power supply 101 is turned on, power is supplied to the integrated circuit 103 of the printing apparatus 112. If the "automatic power-on function" is set to "enabled", the integrated circuit 103 sets itself in the sleep mode to set a state in which it can process a job, and suppression of power consumption of the printing apparatus 112 is implemented. When the main body power switch 111 is operated, the integrated circuit 103 returns from the sleep mode to the normal operation mode, and the printing apparatus 112 is set in the standby state. On the other hand, if the "automatic power-on function" is set to "disabled", power supply to the integrated circuit 103 is stopped, and power consumption of the printing apparatus 112 is suppressed more. When the main body power switch 111 is operated, power supply to the integrated circuit 103 is performed, the integrated circuit 103 is set in the normal operation mode, and the printing apparatus 112 is set in the standby state.

Referring back to FIG. 2, the ROM 107 stores the user setting concerning the "automatic power-on function". In the state 603 shown in FIG. 6, the power supply unit 102 supplies power to the integrated circuit 103, the latch circuit 201, and the switch detection circuit 202. When the power is supplied, the integrated circuit 103 sets itself in the sleep mode. At this time, power supply to the printhead 108 and the display unit 109 is stopped. Upon detecting the operation on the main body power switch 111, the switch detection circuit 202 sends a signal to the integrated circuit 103, and the integrated circuit 103 returns itself from the sleep mode to the normal operation mode.

In the state 604 shown in FIG. 6, the power supply unit 102 supplies power to the latch circuit 201 and the switch detection circuit 202. At this time, power supply to the integrated circuit 103, the printhead 108, and the display unit 109 is stopped. When transitioning to the state 604, the integrated circuit 103 sends a signal to the power supply unit 102 via the latch circuit 201. After that, the power output switch 203 switches, and power supply to the integrated circuit 103 is stopped. Since the latch circuit 201 holds the signal described above, the stop of power supply to the integrated circuit 103 is maintained. Upon detecting the operation on the main body power switch 111, the switch detection circuit 202 sends a signal to the power supply unit 102 via the latch circuit 201. After that, the power output switch 203 switches, power is supplied to the integrated circuit 103, and the integrated circuit 103 is set in the normal operation mode.

Figure 3:
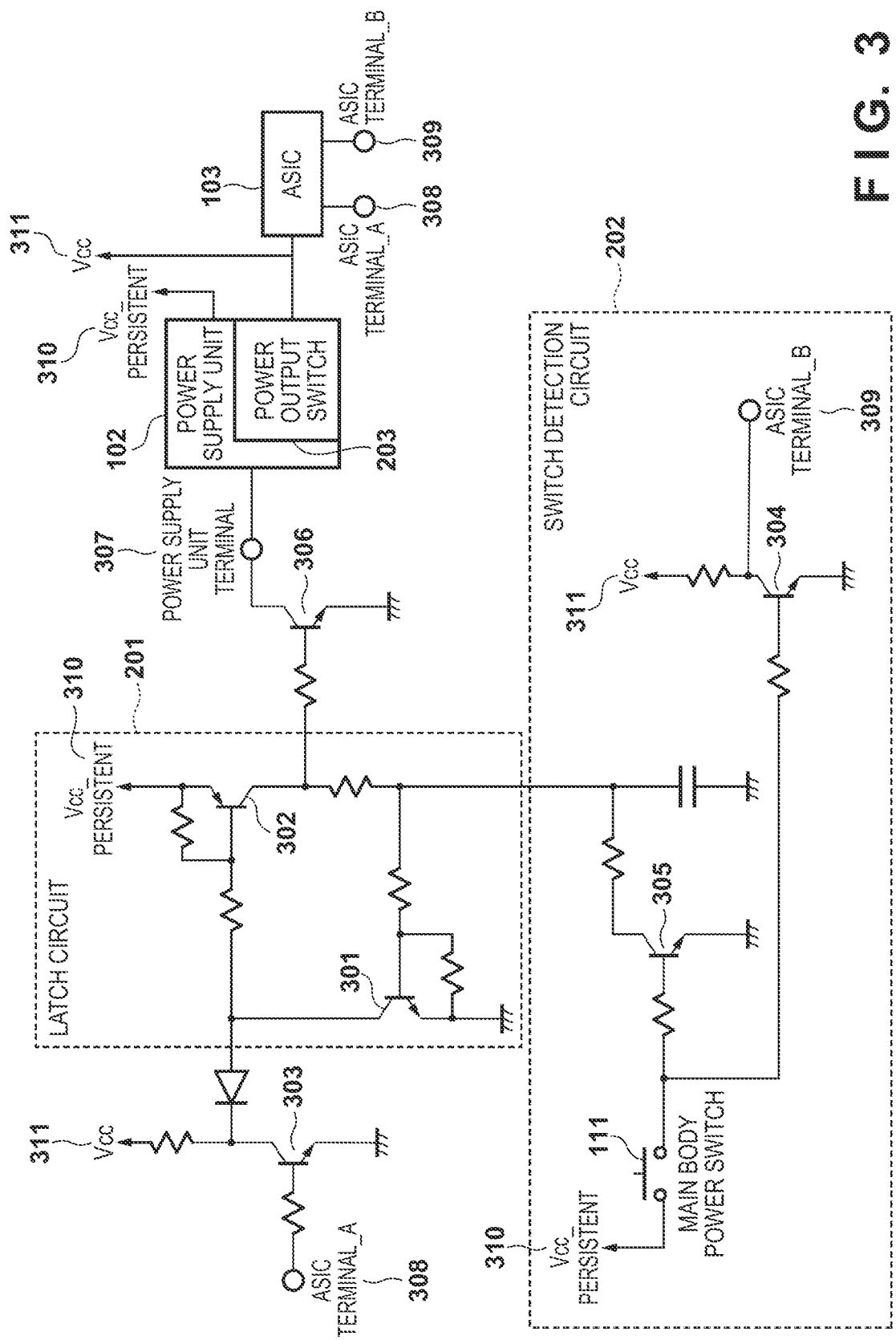
FIG. 3 is a circuit diagram showing a circuit configuration concerning power supply control of the printing apparatus.

FIG. 3 is a circuit diagram showing an example of a circuit configuration concerning the power supply control function of the printing apparatus 112. As the power output by the power supply unit 102, there exist a power supply Vcc (persistent) 310 that is always output when the AC power supply is on, and a power supply Vcc 311. The two power supplies are switched by the power output switch 203. The latch circuit 201 includes an NPN transistor 301 and a PNP transistor 302. A power supply unit terminal 307 is configured as an internal pull-up. If an NPN transistor 306 is off, the output from the power supply unit terminal 307 changes to High by the internal pull-up, and the power supply Vcc 311 is output. On the other hand, if the NPN transistor 306 is on, the output from the power supply unit terminal 307 changes to Low, and the power supply Vcc 311 is stopped.

When the AC power supply 101 is turned on, the NPN transistor 306 is off. Hence, the power supply unit 102 outputs the power supply Vcc 311, power is supplied to the integrated circuit 103, and the integrated circuit 103 is set in the normal operation mode.

When transitioning from the state 602 to the state 604, that is, if the "automatic power-on function" is "disabled" as the user setting, the integrated circuit 103 sets the level of a terminal 308 to High. When the level of the terminal 308 changes to High, an NPN transistor 303 is turned on. When the NPN transistor 303 is turned on, the PNP transistor 302 is turned on, and the NPN transistor 301 is also turned on. As a result, the ON state of the PNP transistor 302 and the NPN transistor 301 is maintained, and the latch circuit 201 is set in the enabled state. When the latch circuit 201 is set in the enabled state, the NPN transistor 306 is turned on as its base terminal is fixed at High. The output from the power supply unit terminal 307 changes to Low, and power supply to the integrated circuit 103 is stopped.

If the main body power switch 111 is operated in the state 604, an NPN transistor 305 is turned on as its base terminal changes to High. When the NPN transistor 305 is turned on, the NPN transistor 301 is turned off as its base terminal changes to Low. When the NPN transistor 301 is turned off, the PNP transistor 302 is turned off as its base terminal changes to High. As a result, the latch circuit 201 is set in the disabled state. When the latch circuit 201 is set in the disabled state, the NPN transistor 306 is turned off as its base terminal is fixed at Low. Then, the output from the power supply unit terminal 307 changes to High by the internal pull-up, and power supply to the integrated circuit 103 is resumed. The integrated circuit 103 is set in the normal operation mode, and the printing apparatus 112 transitions to the state 605.

As described above, if the "automatic power-on function" is "disabled" as the user setting, the latch circuit 201 is set in the enabled state by output control of the terminal 308 of the integrated circuit 103, and as a result, power supply to the integrated circuit 103 is stopped. When the main body power switch 111 is operated, the latch circuit 201 is set in the disabled state, power supply to the integrated circuit 103 is resumed as a result, and the integrated circuit 103 is set in the normal operation mode.

When transitioning from the state 602 to the state 603, that is, if the "automatic power-on function" is "enabled" as the user setting, the integrated circuit 103 sets itself in the sleep mode by limiting some functions such as peripheral functions. When the main body power switch 111 is operated in the state 603, an NPN transistor 304 is turned on as its base terminal changes to High. Hence, the level of a terminal 309 of the integrated circuit 103 changes to Low. When Low of the terminal 309 is detected, the integrated circuit 103 cancels limitation of the functions, and returns from the sleep mode to the normal operation mode, and the printing apparatus 112 transitions to the state 605.

As described above, if the "automatic power-on function" is "enabled" as the user setting, the integrated circuit 103 sets itself in the sleep mode. When the main body power switch 111 is operated, the level of the terminal 309 of the integrated circuit 103 changes to Low, and the integrated circuit 103 returns from the sleep mode to the normal operation mode.

In this embodiment, as described above, the latch circuit 201 operates as a signal generation circuit that generates a signal for controlling power supply to the integrated circuit 103 based on the function of the latch circuit including transistors.

Figure 4:
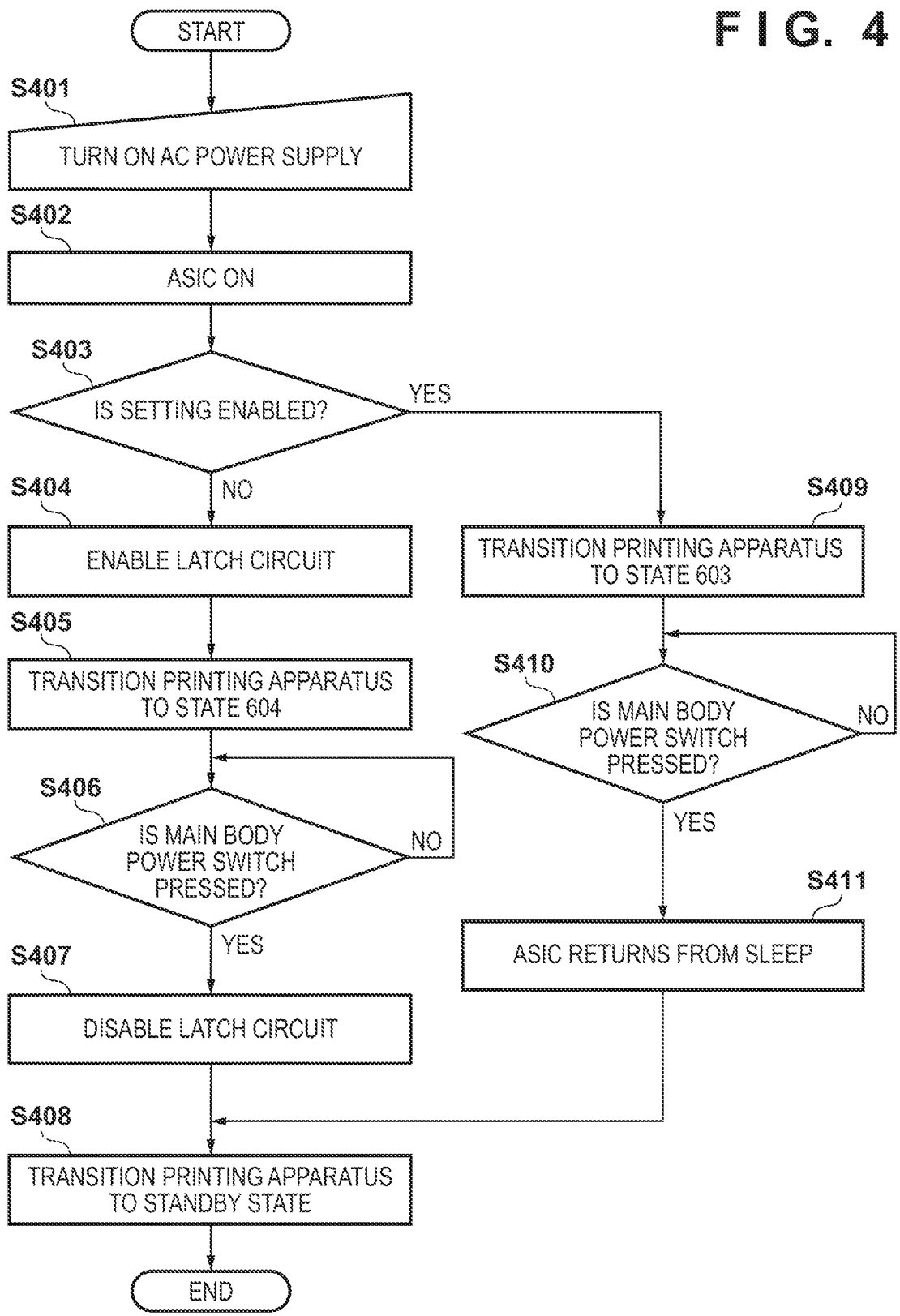
FIG. 4 is a flowchart showing processing until the printing apparatus transitions to a standby state.

FIG. 4 is a flowchart showing processing after the AC power supply 101 is turned on until the printing apparatus 112 transitions to the standby state. If the AC power supply 101 is turned on in step S401, in step S402, the power supply Vcc 311 is supplied to the integrated circuit 103, and the integrated circuit 103 is temporarily set in the normal operation mode, as described with reference to FIG. 3.

In step S403, the integrated circuit 103 refers to the user setting concerning the "automatic power-on function" stored in the ROM 107, and determines whether the "automatic power-on function" is set to "enabled" or "disabled". If it is determined that the "automatic power-on function" is set to "enabled", the process advances to step S409. If it is determined that the "automatic power-on function" is set to "disabled", the process advances to step S404.

In step S409, the integrated circuit 103 sets itself in the sleep mode. In step S410, the integrated circuit 103 determines, based on the change of the level of the terminal 309, whether the main body power switch 111 is operated. The processing of step S410 is repeated until it is determined that the main body power switch 111 is operated. If it is determined that the main body power switch 111 is operated, for example, if the integrated circuit 103 detects Low of the terminal 309, in step S411, the integrated circuit 103 returns from the sleep mode to the normal operation mode. Then, in step S408, the integrated circuit 103 makes the printing apparatus 112 transition to the standby state. After that, the processing shown in FIG. 4 is ended.

As described above, when the AC power supply 101 is turned on, the integrated circuit 103 changes to the normal operation mode and then to the sleep mode. That is, if the "automatic power-on function" is set to "enabled", the integrated circuit 103 is set in a state in which it can process a job, and suppression of power consumption is implemented. If the user operates the main body power switch 111, the integrated circuit 103 returns from the sleep mode to the normal operation mode, and the printing apparatus 112 is set in the standby state.

If it is determined in step S403 that the "automatic power-on function" is set to "disabled", in step S404, the integrated circuit 103 sets the latch circuit 201 in the enabled state by level setting to the terminal 308. As a result, in step S405, power supply to the integrated circuit 103 is stopped, as described with reference to FIG. 3. After step S405, in step S406, when the main body power switch 111 is operated, in step S407, the switch detection circuit 202 sets the latch circuit 201 in the disabled state, as described with reference to FIG. 3. As a result, power supply to the integrated circuit 103 is resumed, and the integrated circuit 103 is set in the normal operation mode. In step S408, the integrated circuit 103 makes the printing apparatus 112 transition to the standby state. After that, the processing shown in FIG. 4 is ended.

As described above, when the AC power supply 101 is turned on, the integrated circuit 103 is set in the normal operation mode, and then, power supply to the integrated circuit 103 is stopped. That is, if the "automatic power-on function" is set to "disabled", power supply to the integrated circuit 103 is stopped, and further suppression of power consumption and suppression of a leakage current from the integrated circuit 103 are implemented. If the user operates the main body power switch 111, the latch circuit 201 is set in the disabled state. Hence, power supply to the integrated circuit 103 is resumed, the integrated circuit 103 is set in the normal operation mode, and the printing apparatus 112 is set in the standby state.

FIG. 5A is a flowchart showing processing in a case in which power supply to the power supply unit 102 is cut off when the printing apparatus 112 is in the state 603, that is, when the integrated circuit 103 is in the sleep mode. Here, the case in which power supply to the power supply unit 102 is cut off is, for example, a case in which a power outage occurs or a case in which the user removes the AC cable.

If power supply to the power supply unit 102 is cut off in step S501, in step S502, the power supply Vcc (persistent) 310 and the power supply Vcc 311 are turned off, and the processing shown in FIG. 5A is ended. In this embodiment, the latch circuit 201 is in the disabled state unless the integrated circuit 103 performs level setting of the terminal 308. For this reason, the integrated circuit 103 is in the disabled state in step S502. Hence, if the AC power supply 101 is turned on next, power supply to the integrated circuit 103 is performed, and processing from step S402 of FIG. 4 is executed.

FIG. 5B is a flowchart showing processing in a case in which power supply to the power supply unit 102 is cut off when the printing apparatus 112 is in the state 604, that is, when power supply to the integrated circuit 103 is stopped. Here, the case in which power supply to the power supply unit 102 is cut off is, for example, a case in which a power outage occurs or a case in which the user removes the AC cable.

If power supply to the power supply unit 102 is stopped in step S511, in step S512, the power supply Vcc (persistent) 310 and the power supply Vcc 311 are turned off. In step S511, since power supply to the integrated circuit 103 is stopped, the latch circuit 201 is in the enabled state. However, when the power supply Vcc (persistent) 310 and the power supply Vcc 311 are turned off, the PNP transistor 302 and the NPN transistor 301 are turned off because the potential difference between the collector and the emitter is eliminated, and the latch circuit 201 is set in the disabled state (step S513). Hence, if the AC power supply 101 is turned on next, power supply to the integrated circuit 103 is performed, and processing from step S402 of FIG. 4 is executed.

As described above, according to this embodiment, even if power supply to the power supply unit 102 is cut off in the state 603 or the state 604, the latch circuit 201 is set in the disabled state. As a result, if the AC power supply 101 is turned on next, power supply to the integrated circuit 103 is performed. After that, appropriate power supply control for the integrated circuit 103 is performed in accordance with the set contents of the "automatic power-on function".

According to the present disclosure, it is possible to appropriately control power supply to the integrated circuit.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-084085, filed May 18, 2021, which is hereby incorporated by reference herein in its entirety.

What is claimed is:

1. A processing apparatus comprising:
   an integrated circuit configured to operate as a controller that controls an interior of the processing apparatus;
   a power supplier configured to be connected to an external power supply and to supply power to the integrated circuit;
   a power switch configured to switch a state of the processing apparatus based on power supplied from the power supplier; and
   a signal generation circuit configured as a latch circuit including a transistor, the signal generation circuit being connected to the integrated circuit and the power supplier, and
   a storage unit configured to store a user setting,
   wherein a first state of the signal generation circuit generates a first signal for causing the power supplier to supply power to the integrated circuit and a second state of the signal generation circuit generates a second signal for causing the power supplier to stop power supply to the integrated circuit, and
   wherein the integrated circuit sets a terminal of the integrated circuit to control a level of a base terminal of the transistor included in the latch circuit, wherein, if the user setting is a first setting, the integrated circuit is configured to, in a state that power is supplied to the integrated circuit from the power supplier, set the level of the base terminal of the transistor included in the latch circuit to cause the signal generation circuit to transition to the second state, and, if the user setting is a second setting, the integrated circuit is configured make a state of the integrated circuit transition to a sleep mode where power consumption is less than in a normal operation mode in which power supply to the integrated circuit is performed by the power supplier, wherein, if the user setting is the first setting, the signal generation circuit transmits to the power supplier the second signal for causing the power supplier to stop power supply to the integrated circuit, and the power supplier stops power supply to the integrated circuit based on the second signal for causing the power supplier to stop power supply to the integrated circuit, wherein the signal generation circuit is connected to the power switch, and wherein, after power supply to the integrated circuit by the power supplier is stopped, based on an operation on the power switch, the signal generation circuit transitions to the first state and transmits to the power supplier the first signal for causing the power supplier to supply power to the integrated circuit, and the power supplier resumes power supply to the integrated circuit based on the first signal for causing the power supplier to supply power to the integrated circuit.

2. The apparatus according to claim 1, wherein if the external power supply is cut off, the signal generation circuit transitions to the first state.

3. The apparatus according to claim 1, wherein, if the signal generation circuit generates the second signal in the second state, the second state is maintained even after power supply to the integrated circuit is stopped based on the generated second signal.

4. The apparatus according to claim 3, wherein the signal generation circuit transitions to the first state based on an operation of the power switch being accepted.

5. The apparatus according to claim 1, wherein the level of the base terminal of the transistor included in the latch circuit is set by an operation of the power switch.

\* \* \* \* \*